United States Patent [19]

Berutto et al.

[11] Patent Number: 4,602,138
[45] Date of Patent: Jul. 22, 1986

[54] KEYBOARD WITH REMOVABLE MODULAR KEYS

[75] Inventors: Eugenio Berutto, Ivrea; Giovanni Franchino, Tavagnasco; Lino Sella, Banchette, all of Italy

[73] Assignee: Ing. C. Olivetti & C., S.p.A., Turin, Italy

[21] Appl. No.: 729,906

[22] Filed: May 3, 1985

Related U.S. Application Data

[63] Continuation of Ser. No. 536,651, Sep. 28, 1983, abandoned.

[30] Foreign Application Priority Data

Sep. 28, 1982 [IT] Italy .................. 68141 A/82

[51] Int. Cl.[4] .............................................. H01H 9/08
[52] U.S. Cl. .................. 200/340; 200/159 B; 200/295
[58] Field of Search .............. 200/295, 296, 159 B, 200/340, 5 A; 400/490

[56] References Cited

U.S. PATENT DOCUMENTS

| | | |
|---|---|---|
| 3,773,998 | 11/1973 | Seeger, Jr. et al. ............. 200/159 B |
| 3,950,627 | 4/1976 | Murata et al. ................ 200/159 R |
| 4,117,292 | 9/1978 | Hayes et al. .................. 200/159 B |
| 4,170,104 | 10/1979 | Yamagata ..................... 200/159 B |
| 4,386,252 | 5/1983 | Kondo et al. ................... 200/296 |
| 4,390,765 | 6/1983 | Sado et al. .................... 200/159 B |
| 4,439,646 | 3/1984 | Bouvrande .................... 200/159 B |
| 4,453,061 | 6/1984 | Tamura ........................ 200/159 B |

FOREIGN PATENT DOCUMENTS 2719194 11/1978 Fed. Rep. of Germany ...... 200/295

Primary Examiner—Stephen Marcus
Assistant Examiner—Renee S. Luebke
Attorney, Agent, or Firm—Banner, Birch, McKie & Beckett

[57] ABSTRACT

A contact-type keyboard comprises a plurality of modular keys and a support panel (11) provided with openings (12) in which the keys are inserted. Each key is provided with a pair of resilient tongue portions (51, 52) which lock it to the panel (11) and which are deformable to permit the key to be easily removed from the panel (11). Each key further comprises a resilient system formed by a dome-shaped spring and a coil spring, which are interposed between a movable actuator and the subjacent conducting parts of an electrical circuit.

6 Claims, 10 Drawing Figures

KEYBOARD WITH REMOVABLE MODULAR KEYS

This application is a continuation of application Ser. No. 536,651, filed Sept. 28, 1983, now abandoned.

BACKGROUND OF THE INVENTION

1. Field of the Invention

The present invention relates to keyboards in which actuation of a key makes an electrical contact in a circuit associated with that key. A keyboard of this type is hereinafter called a contact-type keyboard. A contact-type keyboard may comprise a plurality of modular keys and a support plate or panel provided with a like plurality of openings, for receipt of the modular keys.

2. Description of the Prior Art

Such a keyboard is known, in which modular keys, after having been inserted into respective corresponding openings in the support panel, are held in that position by a second plate or panel which is fixed to the first panel by means of screws. In that way, with the keyboard assembled, the keys are imprisoned between the two panels and only their actuators project from the openings in the first of the two panels.

While that known keyboard has some advantages, arising from the compactness of its structure, nonetheless it suffers from the disadvantage that it does not permit individual modular keys to be easily removed. In fact, in order even to replace one of the keys, the entire keyboard has to be dismantled: that is to say, it is necessary to remove the second panel from the first panel, replace the key or keys which are to be changed, and put the two panels back together again.

SUMMARY OF THE INVENTION

A first object of the present invention is to provide a keyboard which is compact, reliable and economical and in which each individual modular key can easily be removed from the support panel, for exchange for another key, for example.

The present invention provides, in a first aspect, a contact-type keyboard comprising a plurality of modular keys and a support plate or panel provided with a like plurality of openings, for receipt of respective modular keys, characterised in that at least one modular key comprises resilient means deformable from a first position in which, when the key is positioned in an opening in the panel, the resilient means cooperates with the panel to hold the key so positioned, to a second position in which the key may be removed from the opening in the panel.

A second object of the present invention is to provide a keyboard in which electrical contact resulting from depression of a key is produced reliably and accurately after a predetermined displacement of the key.

The invention further provides, in a second aspect, a contact-type keyboard comprising a plurality of pairs of conductors of an electrical circuit, each pair being associated with one of a like plurality of movable actuators, characterised by resilient means interposed between each actuator and the corresponding pair of conductors, the resilient means comprising a first dome-shaped spring associated with a spring having a substantially constant coefficient of elasticity.

These and other features of the invention will be more clearly apparent from the following description of a preferred embodiment described by way of example, only with reference to the accompanying drawing.

DESCRIPTION OF THE PREFERRED EMBODIMENT

Figure 1:
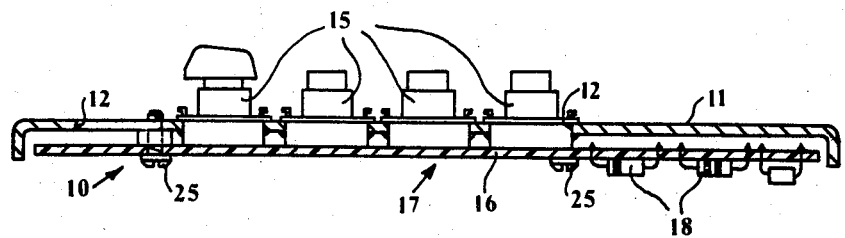
FIG. 1 is a sectional side view of a contact-type keyboard according to the invention.
Figures 3, 5:
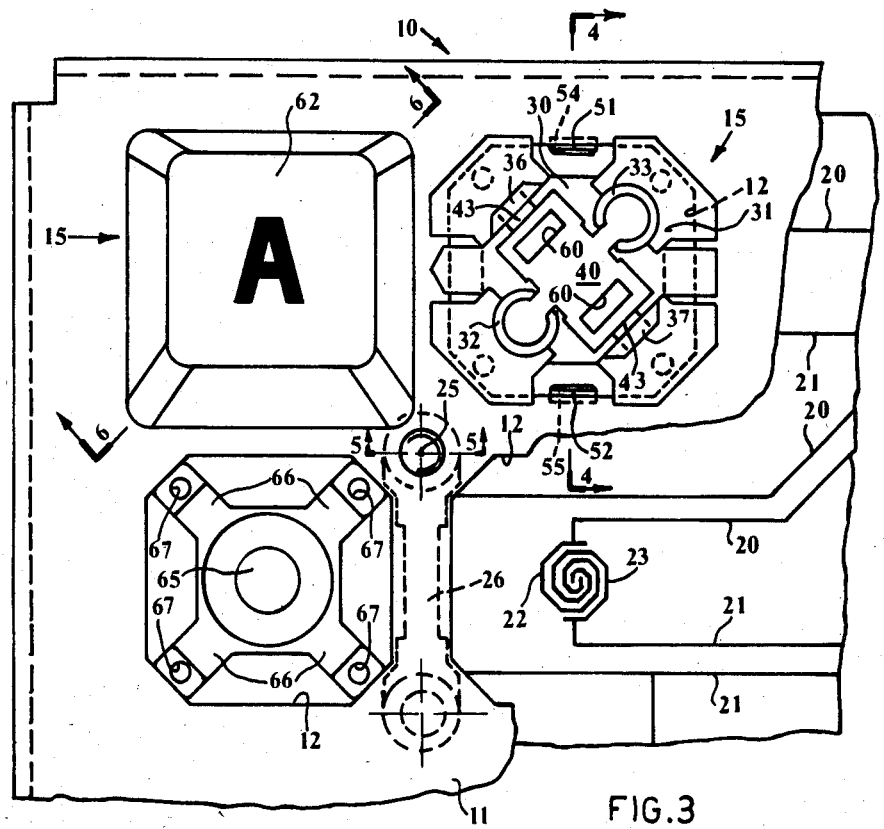
FIG. 3 is a plan view of a part of the keyboard of FIG. 1.
FIG. 5 is a view in section taken along line 5—5 in FIG. 3.

Referring to FIG. 1, a keyboard 10 comprises a metal support plate or panel 11 which is provided with a plurality of openings 12 each substantially an irregular octagon (see FIG. 3). A key 15 is fitted into each opening 12, whereby the positions of the openings 12 in the panel 11 determine the positions assumed by the individual keys 15 when the keyboard 10 is assembled.

The mode of mounting the keys 15 on the panel 11 will be described in detail hereinafter.

Figure 2:
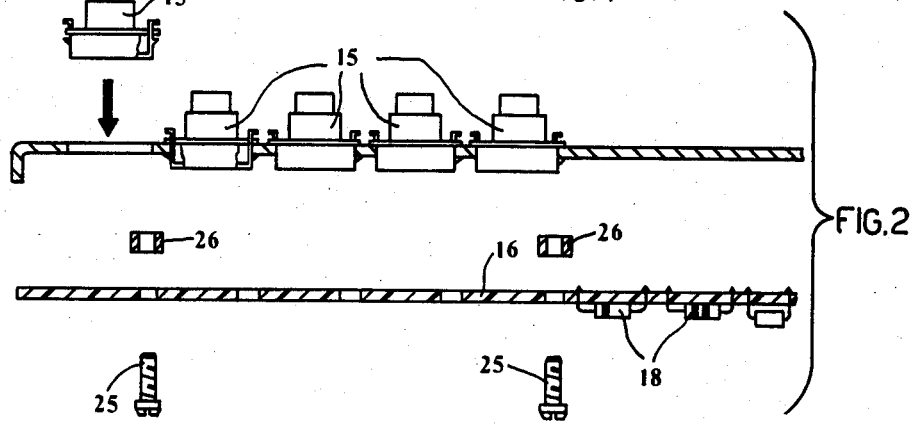
FIG. 2 is an exploded side view of the keyboard of FIG. 1.

A plate or panel 16 of insulating material is fixed in position below the metal plate 11 (see FIGS. 1 and 2) and parallel thereto. On its outward surface, the panel 16 carries a printed circuit 17 and the associated electronic components 18, while on its inward surface the panel 16 carries a plurality of pairs of conductors 20 and 21 (see FIG. 3). Each pair of conductors 20 and 21 has two terminals 22 and 23 which are in the form of inter-engaged spirals and which are positioned below a respective opening 12, so as to be short-circuited upon actuation of the corresponding key 15, as will be seen hereinafter. The two panels 11 and 16 are fixed together by means of screws 25, with the interposition of spacer members 26 of plastics material. The spacer members are so shaped that they can be easily positioned between two adjacent keys 15, after the keys have been mounted in the support panel 11 (see FIGS. 3 and 5).

Figure 4:
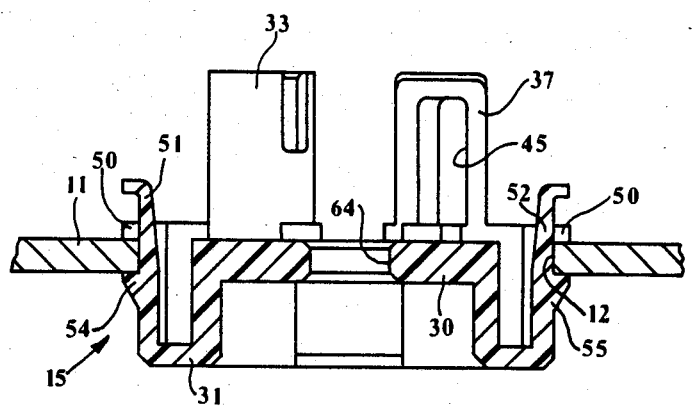
FIG. 4 is a view in section taken along line 4—4 in FIG. 3.

Each key 15 comprises a body portion 30 (see FIGS. 3 and 4) of plastics material, which has a lower base part 31 designed to be inserted into an opening 12, two vertical, hollow, cylindrical guide portions 32 and 33 disposed on opposite sides of a central axis 34 (see FIGS. 6 and 7), and two locking elements 36 and 37 (see FIGS. 3 and 4) which are aligned at 90° with respect to the guides 32 and 33.

The base part 31 is provided with a horizontal shoulder 50 arranged to co-operate with the upper surface of the panel 11, and two resilient vertical tongue portions 51 and 52 disposed at opposite sides of the base part 31 and arranged to cooperate with the bottom surface of the panel 11 by means of tooth portions 54 and 55.

An actuator 40 (see FIGS. 3, 6 and 7) which is movable in the direction of the axis 34 has two lateral cylindrical portions 41 and 42 which are disposed in the guides 31 and 32, and two side limbs 43 received in two grooves or channels 45 (see FIG. 4) of the locking elements 36 and 37. The actuator 40 is provided with a central opening or cavity 46 (see FIGS. 6 and 7), within which is disposed a metal coil spring 48 having a substantially constant coefficient of elasticity. The spring 48 is precompressed with a predetermined loading of a few grams, in order to prevent undesired movements of the actuator 40 in consequence of light loadings applied to the actuator 40.

Provided in the upper part of the actuator 40 (see FIG. 3) are two apertures 60 and legs 61 (see FIG. 6) of a cap member 62 are arranged to be fitted into the apertures 60. Printed on the top part of the cap member 62 is the sign identifying the character or the symbol to which the key 15 relates (see FIG. 3).

A striker 63 (see FIGS. 6 and 7) which is of substantially cylindrical form is movable in the direction of the central axis 34 in a hole 64 in the body portion 30 and its upper part cooperates with the coil spring 48. The lower part of the striker 63 bears on a resilient rubber element 65. The element 65 comprises a central cup or dome supported by four radial arms 66 disposed in a cruciform configuration (see FIG. 3). Each arm 66 is provided with an opening 67 for receiving a corresponding pin portion 68 formed integrally on the body protion 30 of the key 15.

A cylindrical pellet member 69 (see FIGS. 6 and 7) made of conducting rubber is fixed to the underside of each dome 65 to short-circuit the subjacent electrical terminals 22 and 23 when the key 15 is actuated, thereby to generate a corresponding electrical signal.

The keyboard described above is assembled in the following manner:

First of all, each modular key 15 is separately assembled, by fitting the actuator 40 to the body portion 30 in such a way that the lateral cylindrical portions 41 and 42 of the actuator 40 housed in the vertical cylindrical guides 32 and 33 and the side limbs 43 are disposed in the grooves 45 of the locking elements 36 and 37. Then, the coil spring 48 followed by the striker 63 are inserted from underneath, through the hole 64. The dome spring 65 is fitted into place, care being taken to ensure that the lower pin portions 68 of the key portion 30 are fitted into the corresponding openings 67 of the four radial arms 66. Finally, the caps 62 are fitted, by inserting the legs 61 into the apertures 60 of the actuator 40.

When a key 15 has been assembled in that way, is is then fitted from above into an opening 12 in the support panel 11. The two resilient tongue portions 51 and 52 are deformed inwardly of the body portion 30 so as to permit the tooth portions 54 and 55 to pass through the opening 12 and to move into positions under the panel 11 (see FIG. 4). In that position, the horizontal shoulder 50 bears against the upward surface of the panel 11.

The spacer members 26 are then positioned between the lower base parts 31 of the keys 15 which have already been assembled (see FIG. 2), the lower panel 16 is set in position parallel to the panel 11 and the two panels 11 and 16 are locked together by means of the screws 25.

With the two panels 11 and 16 in the assembled condition, each individual key 15 can be easily removed from its opening 12. To remove a key, it is sufficient for the two flexible blade portions 51 and 52 of the body portion 30 to be bent inwardly of the body portion, in order to disengage them from the support panel 11, and then to lift the key upwardly. The structure described has the advantage that the force required for depressing the keys is borne by the support panel 11, which can be metal, not by the panel 16 on which the printed circuit 17 is arranged.

Figure 6:
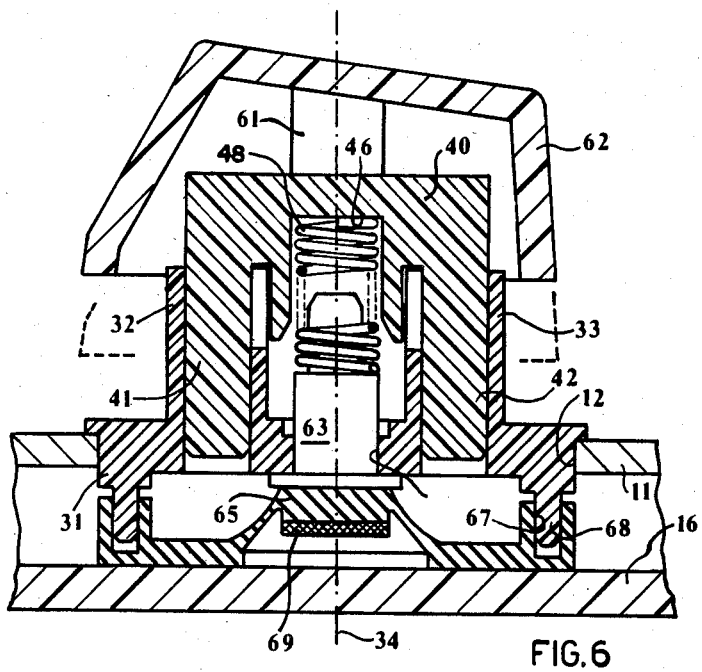
FIG. 6 is a view in section taken along line 6—6 in FIG. 3.
Figure 7:
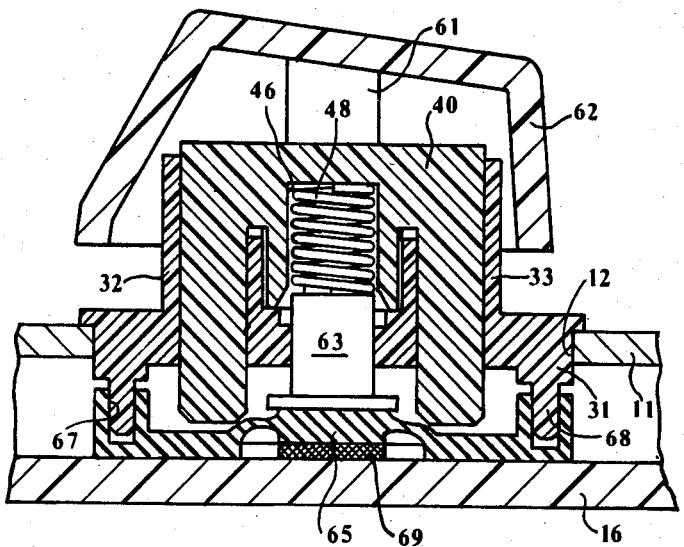
FIG. 7 is the key of FIG. 6 in an operating position.

The mode of operation of each key 15 is as follows:

In the rest condition, the dome spring 65 and the coil spring 48 hold the actuator 40 in the upwardly displaced position (FIG. 6). The member 69 of conducting rubber is spaced from the subjacent terminals 22 and 23, so that the latter are in an open condition.

Before describing the mode of performance of the resilient system formed by the springs 48 and 65, the mode of performance of each of the two springs will be briefly described.

Figure 9:
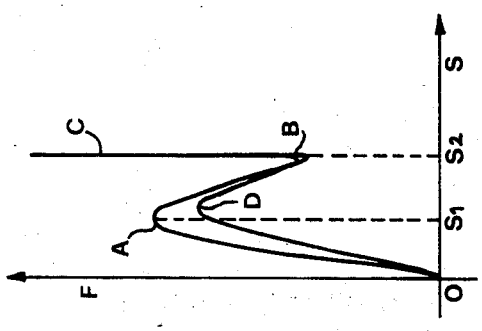
FIG. 9 is a force-displacement diagram of a second type of resilient element of the keyboard according to the second aspect of the invention.
Figure 8:
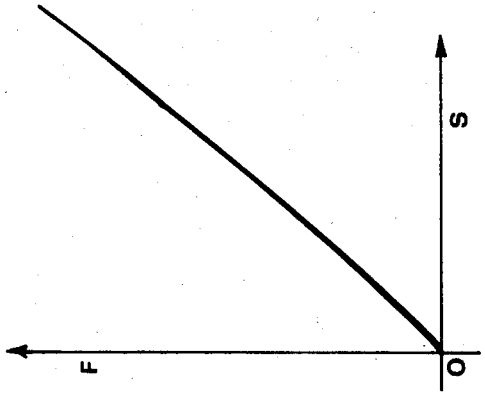
FIG. 8 is a force-displacement diagram of a first type of resilient element of the keyboard according to the second aspect of the invention.

Deformation of the coil spring 48 is directly porportional to the loading applied, both when it is compressed and when it is released, its coefficient of elasticity being substantially constant. FIG. 8, which is a graph of force (F) against displacement (S) for the spring 48, therefore comprises two coincident rectilinear segments. The dome spring 65 on the other hand has the force-displacement graph shown in FIG. 9 in which it is possible to distinguish a first section O-A in which an increase in force corresponds to an increase in the deformation of the spring, until the displacement $S_1$ is reached, corresponding to abrupt yielding of the dome; a second section A-B in which an increase in displacement corresponds to a decrease in force, due to the yielding of the dome, until the displacement $S_2$ is reached, corresponding to the position in which the pellet member 69 bears against the subjacent surface (16); and a third portion B-C in which, the dome having reached the end of its travel, there is no change in displacement corresponding to an increase in force.

The return motion C-B-D-O which is produced by progressively reducing the force on the spring 65 is similar to the forward motion but is not coincident therewith due to the loss of energy in the spring.

Figure 10:
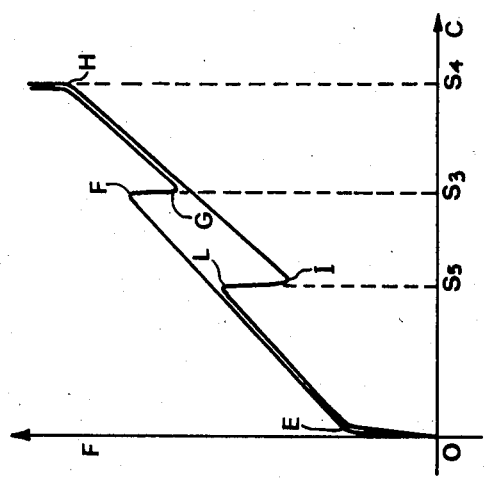
FIG. 10 is a force-displacement diagram of the resilient system associated with each key of the keyboard according to the second aspect of the invention.

The performance of the resilient system formed by the coil spring 48 and the dome spring 65 is as shown in the FIG. 10 graph.

The vertical portion O-E is due to the preloading of the spring 48; the portion E-F represents the sum of the deformations of the spring 48 and the spring 65 until a displaced position $S_3$ is reached, where the jump due to the sudden yielding of the dome 65 occurs; such yielding permits elongation of the spring 48, which is equivalent to a decrease in the force (position F-G). At G, abrupt contact occurs between the member 69 and the terminals 22 and 23, making contact between the terminals whereby a corresponding electrical signal may be produced in any known manner. In the portion G-H, with the dome spring 65 having reached the end of its travel, an increase in the force corresponds only to deformation of the coil spring 48, until the actuator 40 is brought mechanically to a stop (see FIG. 7), after a displacement $S_4$. When the load on the resilient system is progressively released, there is a return portion H-I, during which the spring 48 gradually expands until reaching a non-zero displacement $S_5$. When point I is reached the reaction of the dome spring 65 overcomes the force of the coil spring 48, causing compression thereof (portion I-L). At that time, the member 69 abruptly disengages from the subjacent electrical terminals 22 and 23. The final part L-E-O of the return is similar to the initial starting movement.

It is apparent that modifications to the contact-type keyboard as described above may be made without departing from the scope of the present invention.

We claim:

1. A keyboard comprising a support plate having an external surface and an internal surface and provided with a plurality of through openings; a printed circuit board connected with said support plate; means for maintaining said printed circuit board parallel to and beneath said support plate at a determined small distance therefrom; an electrical circuit carried on a first surface of said printed circuit board facing the internal surface of said first support plate and having a plurality of pairs of fixed electric elements disposed in correspondence with said plurality of through openings; and a plurality of modular keys each removably mounted in said through openings for operating on a corresponding pair of said electric elements, wherein each one of said modular keys comprises:

an actuation member;
a central body having a central longitudinal axis, transverse shoulders, longitudinal guides projecting upwardly from said shoulders for guiding said actuation member, and a lower portion insertable into said through openings, wherein said lower portion defines a cavity and a central hole and comprises a plurality of pins projecting downwardly adjacent to said shoulders and a pair of longitudinal and resilient tongues projecting upwardly from a lowest edge of said lower portion;
an insulated dome spring having a dome portion carrying a movable contact and provided with a lowest edge and a holed portion adjacent to said dome portion and provided with a plurality of holed projections engageable by said plurality of pins to have said dome portion located in said cavity beneath said hole;
an intermediate striker member passing through said hole to operatively connect the dome portion of said dome spring with said actuation member to cause said movable contact to be moved towards and away from said corresponding pair of said electric elements;
and mounting means for removably mounting said central body in each one of said through openings of said first support plate comprising tooth portions and removal portions of said pair of longitudinal tongues;
wherein said tooth portions are cooperable with the internal surface of said support plate, said transverse shoulders are cooperable with the external surface of said support plate, and the removal portions of said pair of longitudinal tongues are manually operable to bend said tongues inwardly with respect to said central body for removing each body and spring dome from the corresponding through opening of said first support plate; and
wherein said central body causes the lowest edge and the holed portion of said dome spring to bear against the firt surface of said printed circuit board upon the cooperation of said transverse shoulders with the external surface of said support plate.

2. A keyboard according to claim 1, wherein the plurality of pins of said central body comprises four pins, wherein said dome-shaped spring is made of rubber material, and wherein said dome portion carries a conductive element which defines said movable contact and said holed portion is provided with four anchor arms disposed in a cruciform configuration and with four corresponding holed projections at the extremities of said arms, wherein said four holed projections comprise four holes, each one on each of said holed projections engageable with said four pins.

3. A keyboard according to claim 1, wherein said actuating member cooperates with said intermediate striker by means of a central coil spring tensioned between said intermediate striker and said actuation member.

4. A keyboard according to claim 3, wherein said central body comprises a stop for arresting the stroke of said actuation member, and wherein said printed circuit board is subject only to the pressure of said coil spring when said actuation member is arrested by said stop while the pressure dependent on any further depression of said actuation member is absorbed by said support plate through the transverse shoulders of said central body.

5. A keyboard according to claim 1, wherein each one of said removal portions of the longitudinal and resilient tongues comprises an upper part of the resilient tongue projecting upwardly from said transverse shoulders.

6. A keyboard comprising a support plate having an external surface and an internal surface and provided with a plurality of through openings each having two pairs of longer edges; a printed circuit board connected to said support plate; means for maintaining said printed circuit board parallel to and beneath said support plate at a determined small distance therefrom; an electrical circuit carried on a first surface of said printed circuit board facing the internal surface of said support plate and having a plurality of pairs of conductors disposed in correspondence with said plurality of through openings; and a plurality of modular keys, each one of said modular keys comprising:

a central body insertable into each one of said through openings and having transverse shoulders and a lower portion including four lower pins projecting downwardly and disposed in a cruciform configuration parallel to diagonals of the two pairs of edges of one through opening upon insertion of said central body into said one through openings, a lower hollow cavity having an axial hole, longitudinal guide means and a stop element;
an insulated dome-shaped spring mounted in said lower hollow cavity and including a dome portion having a base portion and four anchor arms projecting from and coplanar with said base portion, wherein said four anchor arms are disposed in a cruciform configuration, and each arm defines on its free end a projecting portion provided with a longitudinal cavity, and wherein each of said four lower pins is insertable into the longitudinal cavity of the projecting portion of each arm of said dome-shaped spring:
contact means carried by the dome portion of said dome-shaped spring and actuatable for contacting a corresponding pair of conductors of said electrical circuit;
an actuator member guided by said longitudinal guide means along a central longitudinal axis for actuating said contact means;

a striker interposed between said actuator member and said dome-shaped spring;

a central coil spring disposed between said striker and said actuator member; and mounting means for removably mounting said central body in each one of said through openings of said support plate, said mounting means comprising two longitudinal and resilient tongues disposed at opposite sides with respect to said central longitudinal axis and provided with tooth portions cooperable with the internal surface of said first support plate upon cooperation of said transverse shoulders with the external surface of said support plate;

wherein said anchor arms and said base portion of the dome-shaped spring bear on said printed circuit board upon the insertion of said central body in said through opening;

wherein said dome-shaped spring is removable together with said central body through said opening; and wherein said printed circuit board is subjected only to the pressure of said spring means and said dome portion when said actuator member is arrested by said stop, while any further pressure of said actuator member on said stop element is absorbed by said support plate through said transverse shoulders.

* * * * *